United States Patent
Huff et al.

[11] Patent Number: 5,872,401
[45] Date of Patent: Feb. 16, 1999

[54] DEPOSITION OF AN INTER LAYER DIELECTRIC FORMED ON SEMICONDUCTOR WAFER BY SUB ATMOSPHERIC CVD

[75] Inventors: Brett E. Huff, Fremont; Farhad Moghadam, Los Gatos, both of Calif.

[73] Assignee: Intel Corporation, Santa Clara, Calif.

[21] Appl. No.: 609,920

[22] Filed: Feb. 29, 1996

[51] Int. Cl.⁶ .................................................. H01L 23/48
[52] U.S. Cl. .......................................... 257/758; 257/752
[58] Field of Search ............................................. 257/758

[56] References Cited

U.S. PATENT DOCUMENTS

| | | | |
|---|---|---|---|
| 3,617,463 | 11/1971 | Gregor et al. | 204/298.31 |
| 4,702,795 | 10/1987 | Douglas | 437/225 |
| 4,797,375 | 1/1989 | Brownell | 437/187 |
| 4,872,947 | 10/1989 | Wang et al. | 204/192.37 |
| 4,952,274 | 8/1990 | Abraham | 204/192.37 |
| 4,983,540 | 1/1991 | Yamaguchi et al. | 437/930 |
| 5,270,264 | 12/1993 | Andideh et al. | 437/228 |
| 5,514,624 | 5/1996 | Morozumi | 437/195 |
| 5,563,104 | 10/1996 | Jang et al. | 437/235 |
| 5,679,606 | 10/1997 | Wang et al. | 437/195 |
| 5,691,573 | 11/1997 | Avanzino et al. | 257/758 |

FOREIGN PATENT DOCUMENTS

| | | | |
|---|---|---|---|
| 58-93354 | 6/1983 | Japan | 204/192.37 |
| 63-131546 | 6/1988 | Japan | 148/DIG. 158 |

OTHER PUBLICATIONS

Kotani, H., et al., "Sputter Etching Planarization for Multi-level Metallization", J. Electrochem. Soc.: Solid State Science & Tech. Mar. 1983, pp. 645–648.

Vossen, J., et al., "Back Scattering of Material Emitted from RF–Sputtering Targets", RCA Review, Jun. 1970, pp. 293–305.

Valletta R.M., "Control of Edge Profile in Sputter Etching", IBM Tech. Disc. Bull. vol. 10, No. 12, May. 1968, p. 1974.

*Primary Examiner*—Olik Chaudhuri
*Assistant Examiner*—Douglas A. Wille
*Attorney, Agent, or Firm*—Blakely, Sokoloff, Taylor & Zafman LLP

[57] ABSTRACT

A method of depositing an inter layer dielectric. A first layer using plasma enhanced chemical vapor deposition (CVD) is deposited. It is followed by a second layer, deposited using sub atmospheric CVD. The second layer is argon sputter etched.

19 Claims, 8 Drawing Sheets

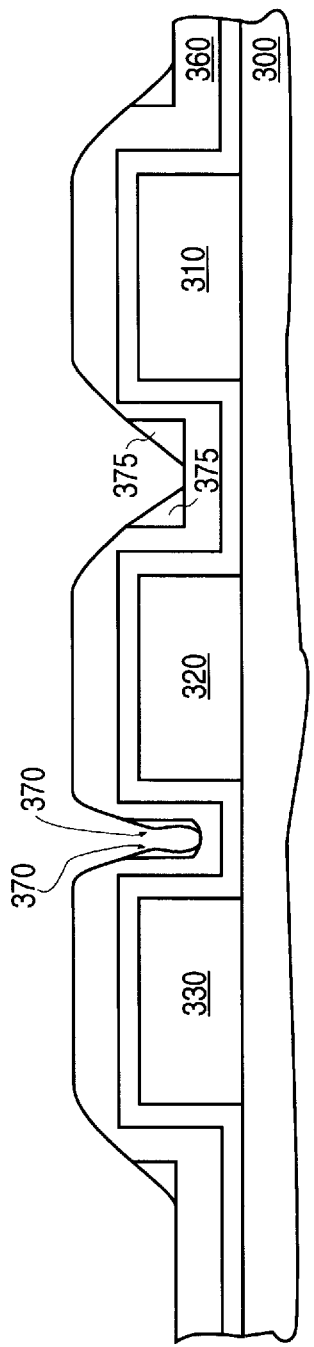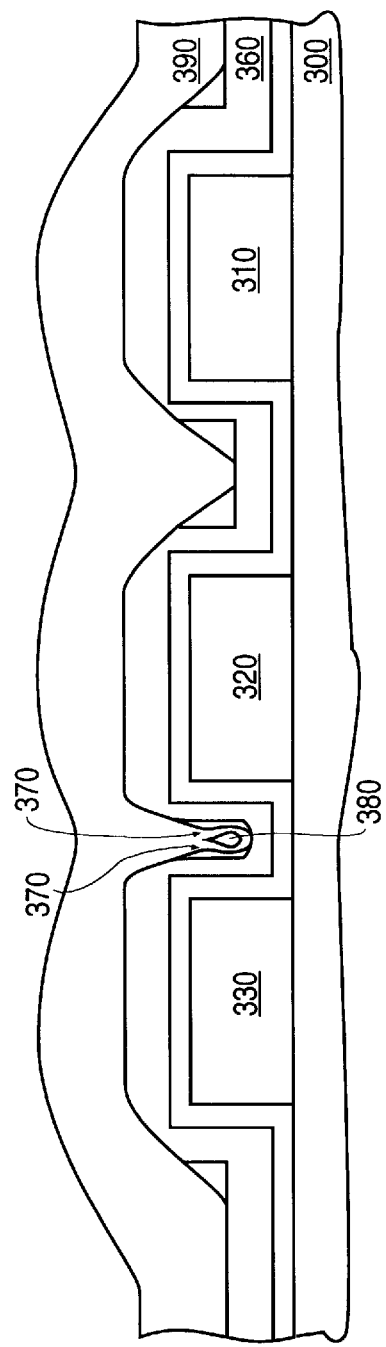

DEPOSITION OF AN INTER LAYER DIELECTRIC FORMED ON SEMICONDUCTOR WAFER BY SUB ATMOSPHERIC CVD

FIELD OF THE INVENTION

The present invention relates to the field of silicon processing; particularly the present invention relates to a method of forming an inter layer dielectric on a semiconductor wafer.

BACKGROUND OF THE INVENTION

In the fabrication of semiconductor devices, numerous conductive device regions and layers are formed in or on a semiconductor substrate. To isolate underlying regions or layers, an inter layer dielectric is formed over those regions. In most modern processes chemical vapor deposition is performed, wherein a solid film of oxide is formed on a substrate by the reaction of an oxide source gas and the substrate. Various parameters such as the oxide source and deposition method influence the characteristics of the resulting inter layer dielectric. In chemical vapor deposition the gas mixture, temperature, RF power, pressure, and gas flow rate, among other factors, may be varied to achieve the desired characteristics.

In many current applications, the inter layer dielectric (ILD) has to conform to exacting specifications. There should be no voids between metal lines at any layer that is above the metal surface in void height, or greater than 25% of the metal spacing in void width. Voids larger than that can be uncovered during further processing causing problems. Composite ILD stress at the post polish thickness should be between 1.0e08 to 9.0e08 dyne/square-cm, compressive. If the inter layer dielectric is not compressive enough, it will result in cracking and short circuits. If the ILD layer is too compressive, it can result in poor oxide metal adhesion which can lead to open circuits within the device. These specifications can not be achieved with present processes.

Smaller semiconductor transistors are formed by decreasing the channel length of the transistor. A problem with manufacturing such small channel devices is that the aspect ratios of various structures on these transistors increases. Aspect ratio is the proportion of the height of a structure to its width. In general, aspect ratio refers to the dimensions of the spaces between structures. Thus, for example, metal aspect ratio describes the ratio of the metal height to the space between the metal structures.

As device sizes shrink, the distance between metal structures on the wafer decreases. Resistance, however, is inversely related to cross sectional area in metals. Increased resistance has numerous disadvantages including increased power consumption and heat emission. Thus, scaling down metal cross sections is disadvantageous. One solution to this is to increase the height of the metal. This, however, leads to increased metal aspect ratios.

Presently, there are a number of methods to deposit inter layer dielectrics. One currently used method is shown in FIGS. 1A–E. Substrate 100 represents a semiconductor substrate and any device layers or structures underlying the metal structures 110 thereon. In order to isolate these metal structures 110 from subsequent layers, a first layer of dielectric 130 is deposited using a plasma enhanced chemical vapor deposition method. Tetraethyl-orthosilicate (TEOS) is used as the oxide source in this deposition. The first layer of dielectric 130 is relatively conformal and high in quality. The deposition profile of the first layer 130 is tapered by an argon sputter etch 140. The argon sputter etch removes oxide from the upper edges, and redeposits part of that oxide in the corners formed by the metal structures 110 and the substrate 100. This redeposited oxide 145 helps taper the deposition profile. A second layer 150 of oxide is then deposited, also using a plasma enhanced chemical vapor deposition method with TEOS as the oxide source (PTEOS). This second layer 150 is a thick sacrificial layer. This second layer 150 then planarized 160.

Although this method was useful in the past, it does not meet the ILD criteria set out above. When aspect ratios increase to 1.5:1 or greater, ILD produced by this process will have voids that exceed 25% of metal width and are higher than the metal surface in height. Thus, this method can not be extended to transistors incorporating aspect ratios of 1.5:1 of greater.

An alternative prior art process is shown in FIGS. 2A–F. A first layer of oxide 230 is deposited over the metal structures 210 on the substrate 200. The first layer is deposited using plasma enhanced chemical vapor deposition of TEOS material (PTEOS). The PTEOS deposited layer 230 is high in quality, compressive and relatively conformal. A nitrogen plasma treatment 240 is applied to the first layer 230. This nitrogen plasma treatment 240 creates a uniform and accepting surface for subsequent layers. A second layer 260 is then deposited using a sub atmospheric chemical vapor deposition (SACVD) of TEOS material. The SACVD produces a lower quality dielectric 260, which is tensile. This layer 260 is then followed by a sacrificial layer 270 formed with the PTEOS method. The sacrificial layer 270 is then planarized 280.

This process can be used for gapfill at 1.0 to 1.5:1 aspect ratios. However, in order to achieve the void specifications described above, the thickness of the SACVD layer 260 used must be greater than 60% of the metal height. Since the SACVD layer 260 is highly tensile, compressive PTEOS layers 230, 270 are needed to balance the SACVD layer 260. Therefore, the ILD resulting from this method is thick. This not only increases overall device size, it also causes problems when vias are formed through the ILD. As the ILD increases in thickness, the aspect ratio of the via increases as well. This causes problems in forming and filling the vias. Therefore, this method is not workable for metal aspect ratios of 1.5:1 or greater.

Thus it is desirable to find a method of depositing an ILD layer that allows for aspect ratios of 1.5:1 or greater, and retains a compressive quality, while not requiring excessive ILD height.

SUMMARY OF THE INVENTION

A method for depositing inter layer dielectric (ILD) between metal structures is described. The method produces a compressive high quality ILD, with no voids that are over 25% of the thickness of the metal structures in width, or over the height of the metal structures in height.

The present invention includes a first layer of oxide deposited using a dual frequency, high oxygen, low pressure plasma enhanced chemical vapor deposition, with TEOS as the oxide source (PTEOS). A second layer of TEOS based oxide is deposited, using sub atmospheric chemical vapor deposition (SACVD). This second layer is 20–30% the height of the metal structures. This second layer is etched using an argon sputter etch.

BRIEF DESCRIPTION OF THE DRAWINGS

The present invention is illustrated by way of example and not limitation in the figures of the accompanying drawings.

FIG. 3E is an illustration of the argon sputter process, and the redeposition of the removed oxide.

FIG. 3F is a cross sectional view of a TEOS based oxide sacrificial layer deposited using plasma enhanced chemical vapor deposition.

DETAILED DESCRIPTION OF THE PRESENT INVENTION

The present invention is a novel method of forming an inter layer dielectric. In the following description, numerous specific details are set forth such as process steps, materials, dimensions, etc., in order to provide a thorough understanding of the present invention. However, it will be obvious to one skilled in the area that the present invention may be practiced without these specific details.

The present invention discloses a four step process for depositing a high quality, compressive inter layer dielectric (ILD). The currently preferred embodiment will be described with reference to the dielectric over the fourth metal level (ILD4). It must be noted that this process can be used at any level of the transistor, and ILD4 is used merely as a concrete example. For ILD4, the metal structures are typically 1.4 $\mu$m in height and metal spacing can be as small as 0.65 $\mu$m. Thus, aspect ratios are in the range of 2.5:1.

Figure 1A:
FIG. 1A–1E is a first prior art method of depositing inter layer dielectric.
Figure 1B:
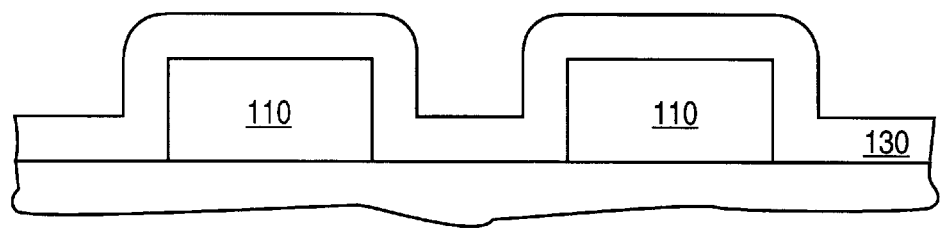
Figure 1C:
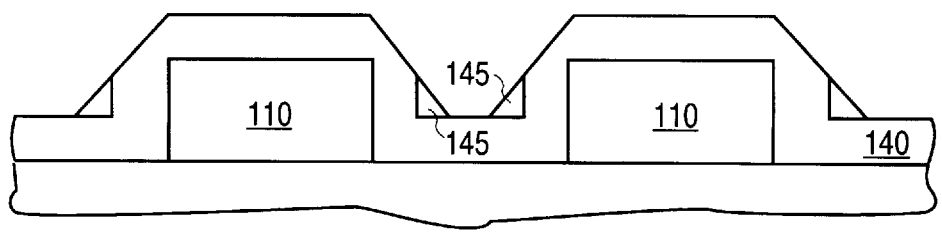
Figure 1D:
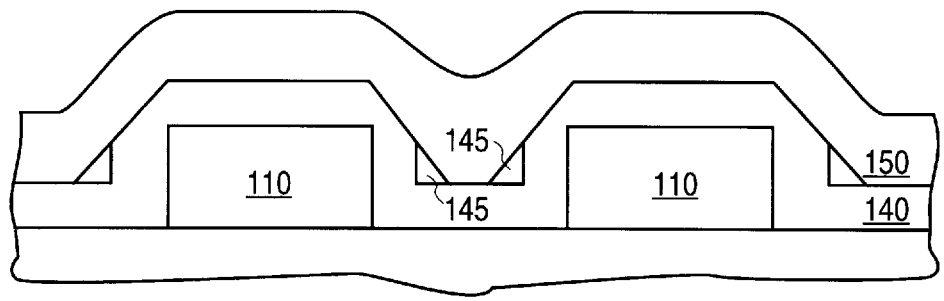
Figure 1E:
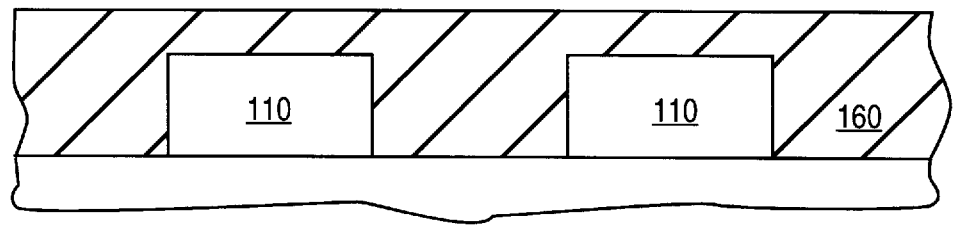
Figure 2A:
FIG. 2A–2F is an alternative prior art method of depositing inter layer dielectric.
Figure 2B:
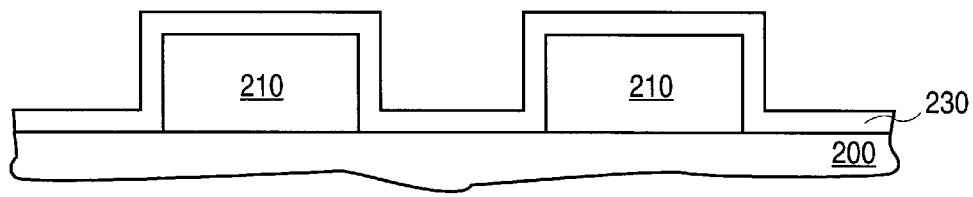
Figure 2C:
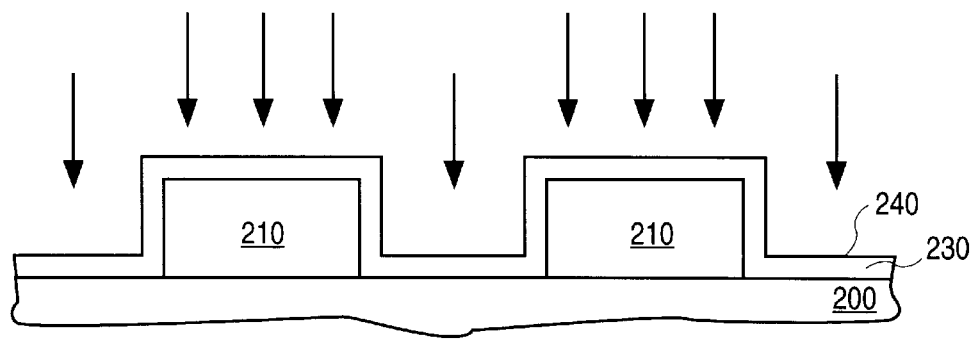
Figure 2D:
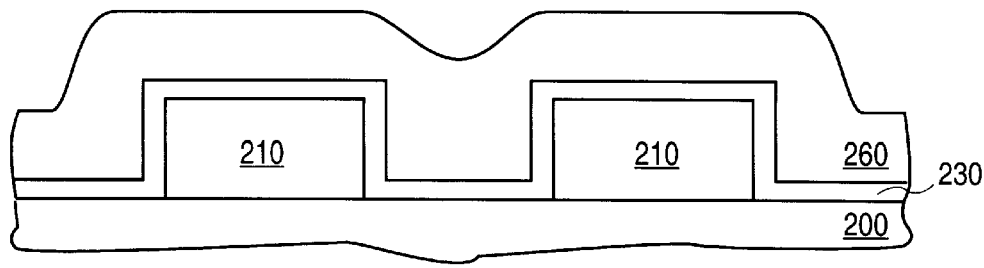
Figure 2E:
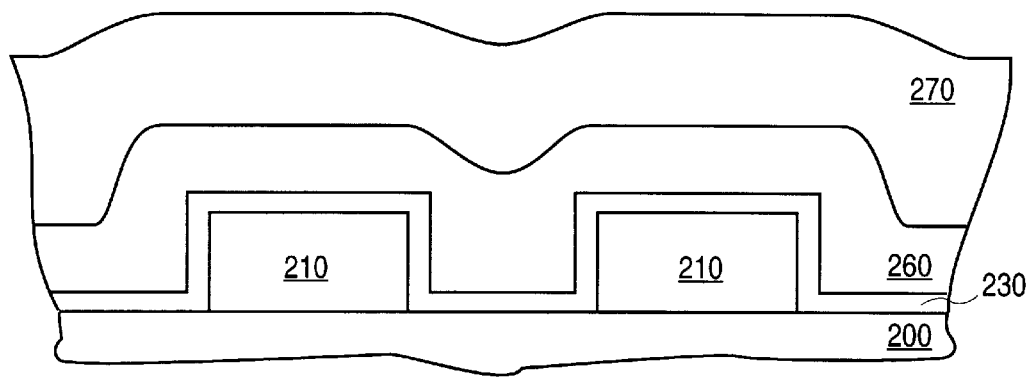
Figure 2F:
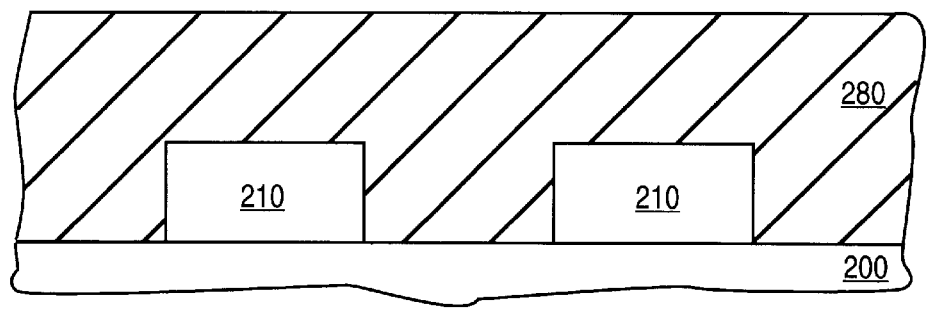
Figure 3A:
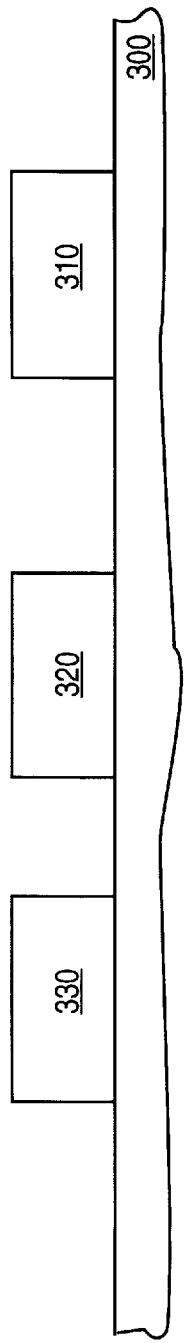
FIG. 3A is cross sectional view of a semiconductor substrate which includes a plurality of metal structures.

Referring to FIG. 3A a cross sectional view of a semiconductor substrate 300 is shown which includes a plurality of metal structures 310, 320, 330. The substrate 300 can be at any level of manufacture. Thus, although the configuration below the substrate 300 is not illustrated, the substrate 300 may be an ILD or other layer over various other substructures.

Figure 3B:
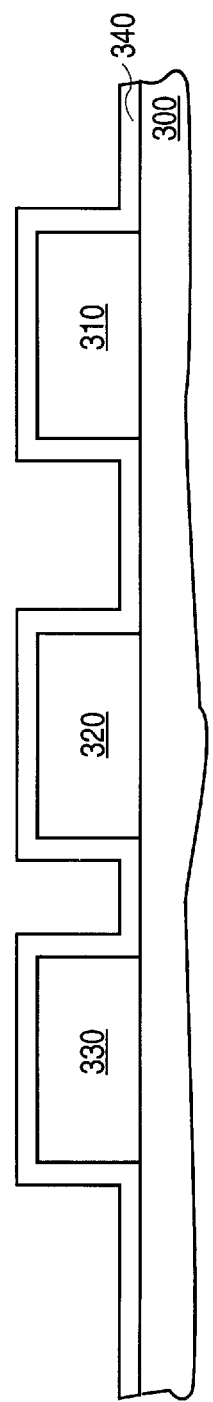
FIG. 3B is a cross sectional view of a TEOS based oxide layer formed using plasma enhanced chemical vapor deposition.

FIG. 3B shows a TEOS based oxide layer 340 formed over the metal structures 310, 320, 330 on the substrate 300. This first, or seed layer 340 is deposited by a plasma enhanced chemical vapor deposition with tetraethylorthosilicate (TEOS) as the reactant gas. A dual-frequency, high-oxygen, low pressure method provides a highly conformal and compressive layer of TEOS based oxide. This method is designated as Delta PTEOS. Using two frequency sources allows the fine tuning of the deposition rate, conformity and compressiveness of the dielectric layer. The high oxygen to helium ratio decreases deposition rate and increases conformality.

Delta PTEOS can be practiced, for example, on the AMAT5000™ manufactured by Applied Materials, which has two frequency sources. For single frequency applications, the standard helium to oxygen ratio is 1:1. Decreasing the helium-oxygen ratio slows down deposition, because helium carries the TEOS material. It also increases conformality. In the currently preferred embodiment, a helium to oxygen ratio of 560:840 is utilized. Single frequency processes utilize a standard pressure for plasma enhanced chemical vapor deposition in the range of 8–10 torr. By reducing the pressure, the uniformity of the deposited layer is increased. In the preferred embodiment low pressure is in the range of 5 torr. Delta PTEOS is performed at 400 degrees Celsius susceptor temperature.

In one embodiment the frequency settings for the Delta PTEOS process were: high frequency (HF) at 375 watts, and low frequency (LF) at 180 watts. The standard LF power level, recommended for the AMAT5000™ is 60 to 80 W. By increasing the LF power, the compressiveness of the material is increased, without sacrificing conformality. Using the higher LF power level, the compressiveness of the PTEOS layer can be adjusted from 1.2e9 to 2.6e9 dyne/square-centimeter.

Layer 340 deposited using Delta PTEOS is approximately 5–10% of metal height. This is in the range of 1000 Å for ILD4. This height is a reasonable moisture barrier that protects the metal structures 310, 320, 330 and substrate 300 from damage by further processing. Using Delta PTEOS is advantageous because the resulting layer 340 is more conformal, the charging impact and thus the damage done to the base layers is decreased, and the layer 340 is highly compressive. High compressive stress is necessary because it is needed to balance the tensile stress of the second layer, described below, with respect to FIG. 3D.

Figure 3C:
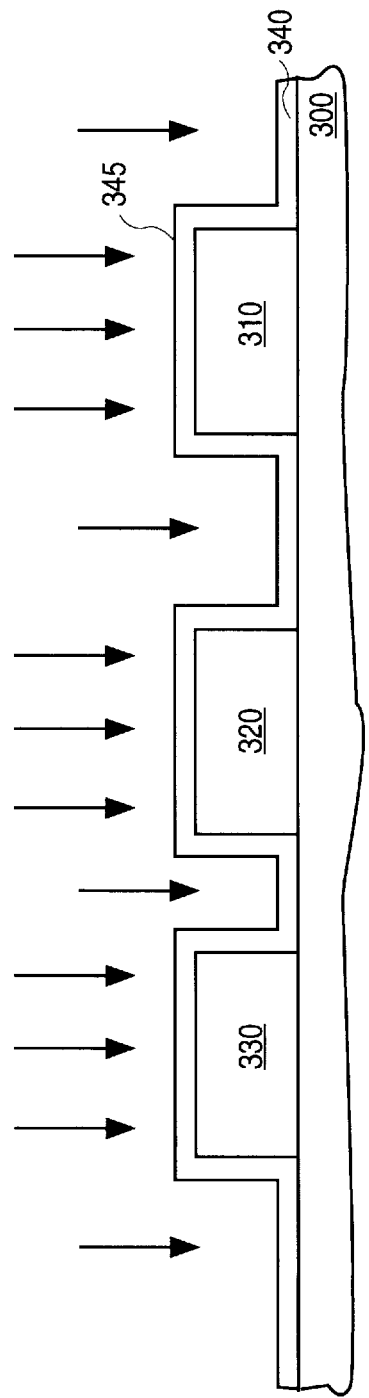
FIG. 3C is an illustration of the nitrogen pretreatment of the TEOS based oxide layer.

FIG. 3C is an illustration of a nitrogen pretreatment 345 of the first layer 340. A nitrogen dual frequency pretreatment 345 prepares the first layer 340 for a second layer, described below. The treatment is not necessary but provides a better and more accepting surface for the second layer. This improves the deposition and film quality of the second layer, and thus the overall ILD.

The dual frequency nitrogen pretreatment 345 takes place in the same processing as the first layer 340. The nitrogen pretreatment 345 is performed with approximately 500 standard cubic centimeters per minute (sccm) of $N_2$, with 2000 sccm helium as dilutant. Pressure is set at approximately 1.5 torr, with HF power at 50 watts and the LF at 400 watts. The susceptor temperature remains at 400 degrees Celsius. The dual frequency nitrogen pretreatment 345 of the Delta PTEOS layer 340 creates a well-controlled uniform surface on which to deposit the next layer.

Figure 3D:
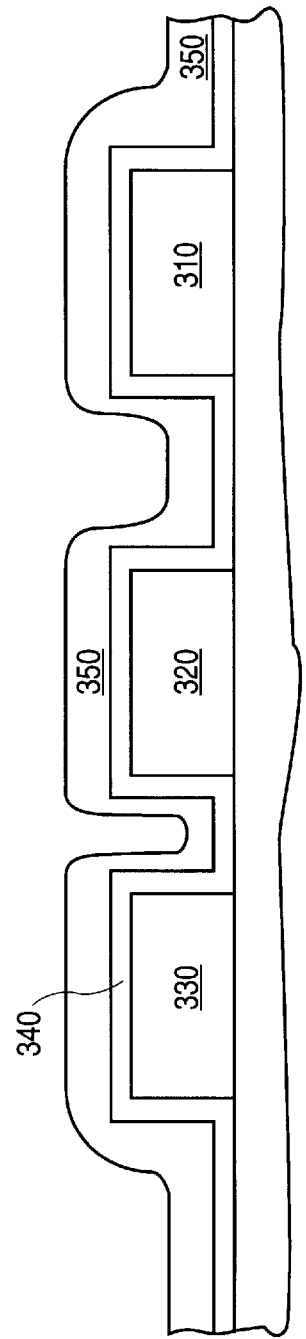
FIG. 3D is a cross sectional view of a TEOS based oxide layer formed using sub atmospheric chemical vapor deposition.

FIG. 3D is a TEOS based oxide layer 350 deposited on the treated surface, using sub atmospheric chemical vapor deposition (SACVD). Sub atmospheric CVD is a low deposition rate CVD deposition, performed at a pressure between 300 and 600 torr. SACVD deposits a lower quality tensile oxide layer, that is excellent for gap fill.

The thickness of the SACVD layer 350 is determined based on the metal thickness. In general, the thickness of the SACVD layer 350 should be between 20–30% of metal thickness. Note that this is a remarkable improvement from the prior art range of 60% of metal height. By reducing the thickness of the SACVD layer, the thickness of the overall ILD layer is reduced. Since the PTEOS deposited layers are of a better quality than the SACVD layer, reducing the relative thickness of the SACVD layer also improves the overall quality of the ILD.

The SACVD process uses a pressure of approximately 450 torr. The gas ratio is 1900 sccm TEOS and 5000 sccm ozone at 8–10% concentration by weight. Sub atmospheric CVD is a temperature driven process. The temperature controls the deposition rate and film quality. The presently preferred temperature is 400 degrees Celsius, which produces a good quality, high density layer. In ILD4, the thickness of the SACVD layer 350 is in the range of 4000 Å, compared to a 1000 Å Delta PTEOS layer 340. The overall ILD layer at this point, after the Delta PTEOS and SACVD layer, is approximately 25–40% of the metal height.

SACVD deposited oxide layer 350 is tensile. The tensile stress of SACVD deposited ILD ranges between 1e9 and 3e9 dyne/square-cm. As discussed above, the overall ILD has to be compressive, and thus the tensile SACVD layer has to be counterbalanced by compressive layers. The highly compressive character of the Delta PTEOS layer 340 described above helps to balance the tensile stress of the SACVD layer 350. However, since the SACVD layer 350 is considerably thicker than the Delta PTEOS layer 340, the ILD at this point is overall tensile. The sacrificial layer, described below with respect to FIG. 3F, balances this makes the completed ILD layer compressive.

FIG. 3E illustrates the tapered deposition profile of the SACVD layer 350 as a result of an argon sputter etch 360. The argon sputter etch 360 eliminates large secondary voids, and shapes the deposition profile. Argon sputter etching 360 removes approximately four times more material from 45% angles than from horizontal surfaces. Therefore, corners are reduced to a much greater extent than level surfaces.

Some of the material removed by the argon sputter etch 360 is redeposited 370, 375. In wide spaces the removed material is redeposited in the corners 375. In narrower spaces, the redeposition is on the side walls, resulting in a pinching in 370. The pinching in 370 is below the metal level. This forces any voids that are subsequently formed to be below metal level, thus conforming with the ILD requirements set out above.

The argon sputter etch 360 is performed at high pressure and zero gauss. Using a high pressure and zero gauss sputter etch reduces the mean free path, which increases the redeposition rate of the oxide. This improves the gapfill and the amount of oxide that is redeposited 370, 375. Additionally, gate oxide charging is reduced, due to the elimination of the magnetic fields.

High pressure is in the range of 100 mTorr, versus the standard 30 mTorr. Magnetic fields are reduced to at, or near, zero, from a standard value of 50–60 gauss. At ILD4 approximately 500 Å is removed on straight surfaces, and 2000 Å is removed at corners. The resulting tapered ILD layers are approximately 20–45% of the metal height at this stage, with no large voids that exceed 25% of metal width or the metal height.

FIG. 3F shows the sacrificial layer 390. The sacrificial layer 390 is formed with Delta PTEOS deposition, using the same process parameters as described above with respect to the first layer 340. The sacrificial layer 390 is much greater in height, on deposition, than other layers. The planned thickness of the final layer, after planarization, has to be taken into account, when depositing the sacrificial layer 390. This planned thickness depends on the further processing intended for the device, the planned compressive stress of the final layer, and other factors.

Small voids 380 may exist in the sacrificial layer 390 if the distance between the metal structures 310, 320, 330 is narrow as between the second structure 320 and the third structure 330. However, because the argon sputter 360 tapered the deposition profile of the SACVD layer 350, these voids 380 are small. Voids, if formed, are below the pinching in 370, and thus below metal level. The voids do not exceed 25% of metal space in width or metal height in height. Therefore, any voids meet the ILD characteristics described above.

Approximately 25,000 Å of oxide is deposited as the sacrificial layer 390 for ILD4. This Delta PTEOS layer is compressive and uniform. At ILD4, the overall ILD is now 30,000 Å in height, and highly compressive. The two Delta PTEOS layers, the first layer 340 and the sacrificial layer 390, are in the range of 5–10 times the height of the argon etched SACVD layer 350. Thus, the overall ILD is very compressive at this stage. However, this is changed in the planarization step, described below.

Figure 3G:
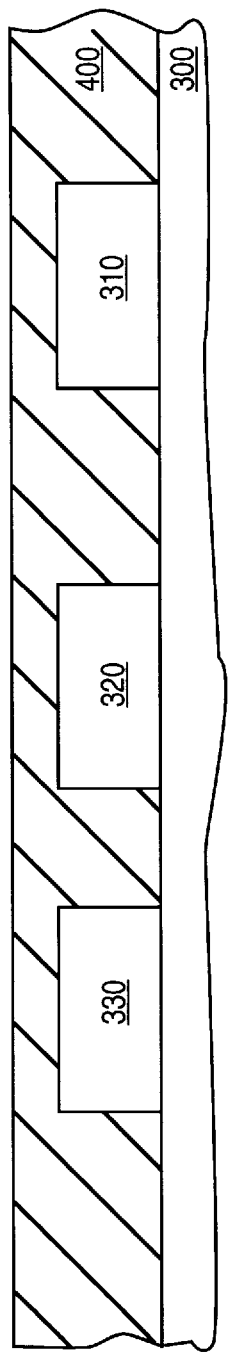
FIG. 3G is a cross sectional view of the sacrificial layer planarized.

FIG. 3G shows the planarized complete ILD 400. Planarization 400 uses standard methods. This planarization removes the excess oxide of the sacrificial layer 390, and creates a very level surface for further processing. The planarization 400 does not uncover any small voids 380 that may be present in the sacrificial layer 390, because these voids are below metal height in height. Therefore, there are no problems with uncovered voids.

Planarization 400 is accomplished by polishing back. This can be done using an silicon dioxide slurry in KOH and water. Alternative methods are well known in the art.

After planarization 400, ideally the minimum thickness of ILD required to isolate the different levels of metal remains. In this process, the minimum thickness of ILD balances the stresses. The final ILD is between 0.5e9 and 1.5e9 dyne/cm$^2$ compressive.

Thus, a novel Delta PTEOS, SACVD, Argon Sputter and Delta PTEOS (DSAD) method of forming a compressive, good quality inter layer dielectric with no voids that are above metal surface in void height and less than 25% of metal spacing in void width, on a substrate with metal structures having high aspect ratios has been described. In the foregoing specification, the invention has been described with reference to the presently preferred embodiment thereof. It will, however, be evident that various modifications and changes may be made thereto without departing from the spirit and scope of the invention as set forth in the appended claims.

We claim:

1. In a semiconductor device having a plurality of structures with a height, a top and a bottom, formed on a semiconductor substrate, and having edges forming corners between said structures and said semiconductor substrate, an inter layer dielectric comprising:

a first dielectric layer substantially conformal with said structures, said first dielectric layer formed by a plasma enhanced chemical vapor deposition, and substantially maintaining said edges, the first dielectric layer having a compressive stress between 1.2e9 and 2.6e9 dyne per square centimeter;

a second dielectric layer said second dielectric layer formed by a sub atmospheric CVD, and substantially maintaining said edges; and a redeposited oxide in said corners, said redeposited oxide having been removed from said edges of said second dielectric layer formed by the subatmospheric CVD and redeposited in said corners by an argon sputter etching.

2. The inter layer dielectric of claim 1, further comprising a planarized third dielectric layer of TEOS based oxide, said third layer dielectric formed by plasma enhanced deposition of a TEOS based oxide and planarization thereof.

3. The inter layer dielectric of claim 1 further comprising a nitrogen treatment layer the nitrogen treatment layer formed by a dual frequency plasma deposition to said first dielectric layer for said second dielectric layer.

4. The inter layer dielectric of claim 1 wherein said second dielectric layer has a thickness of approximately 20–30% of the height of said metal structures.

5. The inter layer dielectric of claim 1 wherein said first dielectric layer is approximately 1000 Å.

6. The inter layer dielectric of claim 1 wherein said first dielectric layer is formed by a dual frequency, high oxygen, and low pressure plasma enhanced deposition.

7. The inter layer dielectric of claim 1 wherein the redeposited oxide in said corners is deposited by a high pressure, zero gauss, argon sputter.

8. The inter layer dielectric of claim 7 wherein the redeposited oxide in said corners deposited by said argon sputter etching comprises approximately four times as much material removed from a 45 degree angled surface as removed from a level surface.

9. The inter layer dielectric of claim 8 wherein the redeposited oxide in said edges deposited by said argon sputter etching comprises approximately 2000 Å of material from said 45 degree angled surface, and approximately 500 Å of material from said level surface.

10. In a semiconductor device having a plurality of structures formed on a semiconductor substrate, said structures having a height and having edges forming corners between said structures and said substrate, an inter layer dielectric comprising:

a first dielectric layer substantially conformal with said structures, said first dielectric layer formed by a dual frequency, high oxygen, low pressure plasma enhanced chemical vapor deposition, and substantially maintaining said edges, the first dielectric layer having a compressive stress between 1.2e9 and 2.6e9 dyne per square centimeter;

said first dielectric layer prepared for a second dielectric layer by a nitrogen dual frequency plasma treatment;

said second dielectric layer said second layer formed by sub atmospheric CVD deposition, and said second dielectric layer having a thickness of 20–30% of the height of said structures, and said second dielectric layer substantially maintaining said edges;

a redeposited oxide in said corners, said redeposited oxide having been removed from said second dielectric layer and redeposited in said corners by a high pressure, zero gauss argon sputter etching; and a planarized third dielectric layer, formed by dual frequency, high oxygen, low pressure plasma enhanced deposition, and planarization thereof.

11. The inter layer dielectric of claim 1 wherein the first dielectric layer is a TEOS based oxide dielectric layer.

12. The inter layer dielectric of claim 1 wherein the second dielectric layer is a TEOS based oxide dielectric layer.

13. The inter layer dielectric of claim 1 wherein said second dielectric layer has a tensile stress between 1e9 and 3e9 dyne per square centimeter.

14. The inter layer dielectric of claim 2 wherein the third dielectric layer has a substantially equal compressive stress to the first layer.

15. The inter layer dielectric of claim 14 wherein the tensile stress of the second dielectric layer balances the compressive stress of the first dielectric layer and the third dielectric layer, thereby producing an overall compressive stress between 0.5e9 and 1.5e9 dyne per square centimeter as a result of the dielectric layers.

16. The inter layer dielectric of claim 1 further comprising:

a void below a pinching formed by the redeposited oxide, and below the top of the structure on the substrate.

17. The inter layer dielectric of claim 16, wherein the void is smaller than a space between the structures and less than the height of the structures.

18. The inter layer dielectric of claim 10 wherein the first dielectric layer is a TEOS based oxide.

19. The inter layer dielectric of claim 10 wherein the second dielectric layer is a TEOS based oxide.

* * * * *